(12) United States Patent
Rofougaran (10) Patent No.: US 8,064,864 B2
(45) Date of Patent: Nov. 22, 2011

(54) RFID USING AN HYBRID ON-CHIP-OFF-CHIP TRANSFORMER

(75) Inventor: Ahmadreza (Reza) Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 421 days.

(21) Appl. No.: 12/433,100

(22) Filed: Apr. 30, 2009

(65) Prior Publication Data
US 2009/0224886 A1 Sep. 10, 2009

Related U.S. Application Data

(62) Division of application No. 11/529,055, filed on Sep. 28, 2006, now Pat. No. 7,751,790.

(51) Int. Cl.
*H04B 1/18* (2006.01)
(52) U.S. Cl. ........ 455/292; 455/333; 455/334; 340/10.1
(58) Field of Classification Search .................. 455/280, 455/292, 323, 333, 334; 340/10.1
See application file for complete search history.

(56) References Cited

U.S. PATENT DOCUMENTS

| 6,717,396 B2 | 4/2004 | Viola | |
| 7,164,344 B2 * | 1/2007 | Deguchi et al. | 340/10.51 |
| 2004/0134985 A1 | 7/2004 | Deguchi | |
| 2005/0242916 A1 * | 11/2005 | So | 336/200 |
| 2006/0238301 A1 * | 10/2006 | Wu et al. | 340/10.1 |
| 2008/0012680 A1 * | 1/2008 | Muelleman | 336/212 |

FOREIGN PATENT DOCUMENTS

KR 10-2005-0013022 2/2005

\* cited by examiner

*Primary Examiner* — Nhan Le
(74) *Attorney, Agent, or Firm* — Garlick Harrison & Markison (57) ABSTRACT

A radio frequency identification (RFID) system includes an RFID reader and an RFID tag. The RFID reader is coupled to transmit first electromagnetic signal via an off-chip winding section of a hybrid on-chip-off-chip transformer. The RFID tag is coupled to receive the first electromagnetic signal via an on-chip winding section of the hybrid on-chip-off-chip transformer, wherein the on-chip winding section derives a second electromagnetic signal from the first electromagnetic signal when the on-chip winding section is within a proximal coupling distance of the off-chip winding section.

5 Claims, 9 Drawing Sheets

RFID USING AN HYBRID ON-CHIP-OFF-CHIP TRANSFORMER

This patent application is claiming priority under 35 USC §121 as a divisional patent application of co-pending patent application entitled HYBRID ON-CHIP-OFF-CHIP TRANSFORMER, having a filing date of Sep. 28, 2006, and a Ser. No. 11/529,055.

STATEMENT REGARDING FEDERALLY SPONSORED RESEARCH OR DEVELOPMENT

NOT APPLICABLE

INCORPORATION-BY-REFERENCE OF MATERIAL SUBMITTED ON A COMPACT DISC

NOT APPLICABLE

BACKGROUND OF THE INVENTION

1. Technical Field of the Invention

This invention relates generally to communication systems and more particularly to a transformer that may be used in such communication systems.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), radio frequency identification (RFID), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system or a particular RF frequency for some systems) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

In many wireless communication devices, the transmitter and/or receiver is coupled to antenna, or antennas, by one or more transformers. Such a transformer typically includes a single-ended winding that is coupled to the antenna and a differential winding that is coupled to a low noise amplifier of a receiver section and/or to a power amplifier of a transmitter section. The transformer may be implemented in a variety of ways. For instance, the transformer may be implemented on-chip with the receiver and/or transmitter section. While an on-chip transformer provides the convenience of not requiring an external transformer, the on-chip transformer's power capabilities are limited due to its size.

Another known implementation of a transformer is a marginal type transformer that is fabricated on a printed circuit board (PCB). A marginal type transformer includes two parallel traces that each is approximately one-quarter wavelength in length. As such, a margin type transformer consumes a significant amount of PCB real estate, but does provide significant power in comparison to the on-chip transformer. As with any transformer, impedance matching between the antenna and receiver or transmitter section is an important design criterion.

In addition to the above uses, transformers are used in a multitude of applications that require an AC voltage to be converted from one level to another with an electrical isolation between the windings. For example, almost all power converters (AC to DC, DC to DC, and DC to AC) include a transformer for a voltage level shift. Typically, the transformer includes a primary winding wrapped around a ferrite core with a secondary winding wrapped around another part of the ferrite core or over the primary winding.

In all of the transformers discussed above, i.e., on-chip transformers, on-PCB transformers, ferrite core transformers, and other types of transformers (e.g., air core), they have a similar construction technique for the primary and secondary windings. For example, the on-chip transformers have both windings fabricated on a die of an integrated circuit. While such transformers offer a wide variety of applications, there are emerging applications that would benefit from a transformer having one of its winding implemented on a die of an integrated circuit while the other winding is implemented off of the die.

Therefore a need exists for a transformer that has one winding implemented on a die of an integrated circuit and another winding implemented off of the die.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Figure 1:
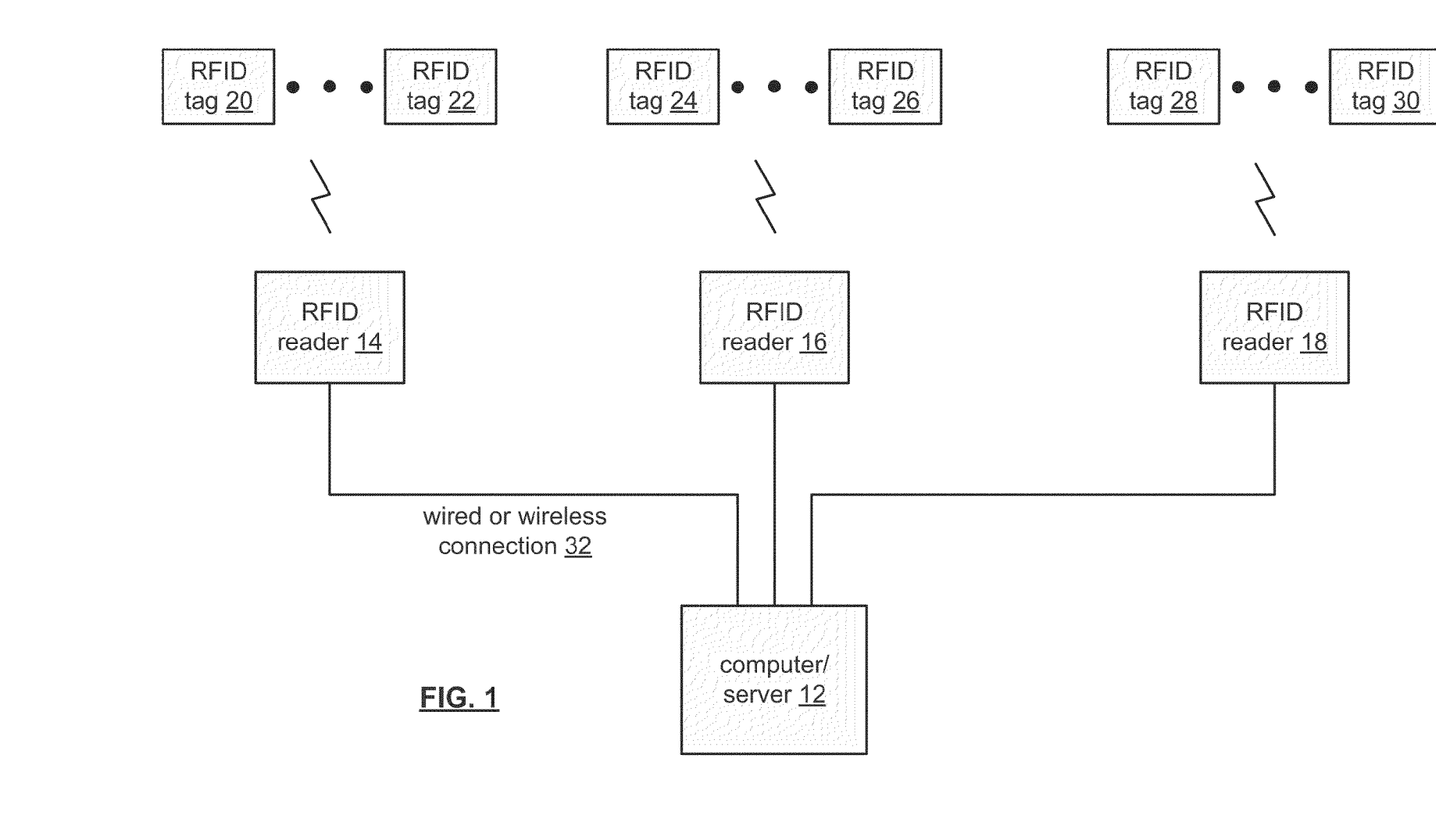
FIG. 1 is a schematic block diagram of a radio frequency identification (RFID) system in accordance with the present invention.

FIG. 1 is a schematic block diagram of an RFID (radio frequency identification) system that includes a computer/server 12, a plurality of RFID readers 14-18 and a plurality of RFID tags 20-30. The RFID tags 20-30 may each be associated with a particular object for a variety of purposes including, but not limited to, tracking inventory, tracking status, location determination, assembly progress, et cetera.

Each RFID reader 14-18 wirelessly communicates with one or more RFID tags 20-30 within its coverage area. For example, RFID reader 14 may have RFID tags 20 and 22 within its coverage area, while RFID reader 16 has RFID tags 24 and 26, and RFID reader 18 has RFID tags 28 and 30 within its coverage area. The RF communication scheme between the RFID readers 14-18 and RFID tags 20-30 may be a backscattering technique whereby the RFID readers 14-18 provide energy to the RFID tags via an RF signal. The RFID tags derive power from the RF signal and respond on the same RF carrier frequency with the requested data.

In this manner, the RFID readers 14-18 collect data as may be requested from the computer/server 12 from each of the RFID tags 20-30 within its coverage area. The collected data is then conveyed to computer/server 12 via the wired or wireless connection 32 and/or via the peer-to-peer communication 34. In addition, and/or in the alternative, the computer/server 12 may provide data to one or more of the RFID tags 20-30 via the associated RFID reader 14-18. Such downloaded information is application dependent and may vary greatly. Upon receiving the downloaded data, the RFID tag would store the data in a non-volatile memory.

As indicated above, the RFID readers 14-18 may optionally communicate on a peer-to-peer basis such that each RFID reader does not need a separate wired or wireless connection 32 to the computer/server 12. For example, RFID reader 14 and RFID reader 16 may communicate on a peer-to-peer basis utilizing a back scatter technique, a wireless LAN technique, and/or any other wireless communication technique. In this instance, RFID reader 16 may not include a wired or wireless connection 32 to computer/server 12. Communications between RFID reader 16 and computer/server 12 are conveyed through RFID reader 14 and the wired or wireless connection 32, which may be any one of a plurality of wired standards (e.g., Ethernet, fire wire, et cetera) and/or wireless communication standards (e.g., IEEE 802.11x, Bluetooth, et cetera).

As one of ordinary skill in the art will appreciate, the RFID system of FIG. 1 may be expanded to include a multitude of RFID readers 14-18 distributed throughout a desired location (for example, a building, office site, et cetera) where the RFID tags may be associated with equipment, inventory, personnel, et cetera. Note that the computer/server 12 may be coupled to another server and/or network connection to provide wide area network coverage.

Figure 2:
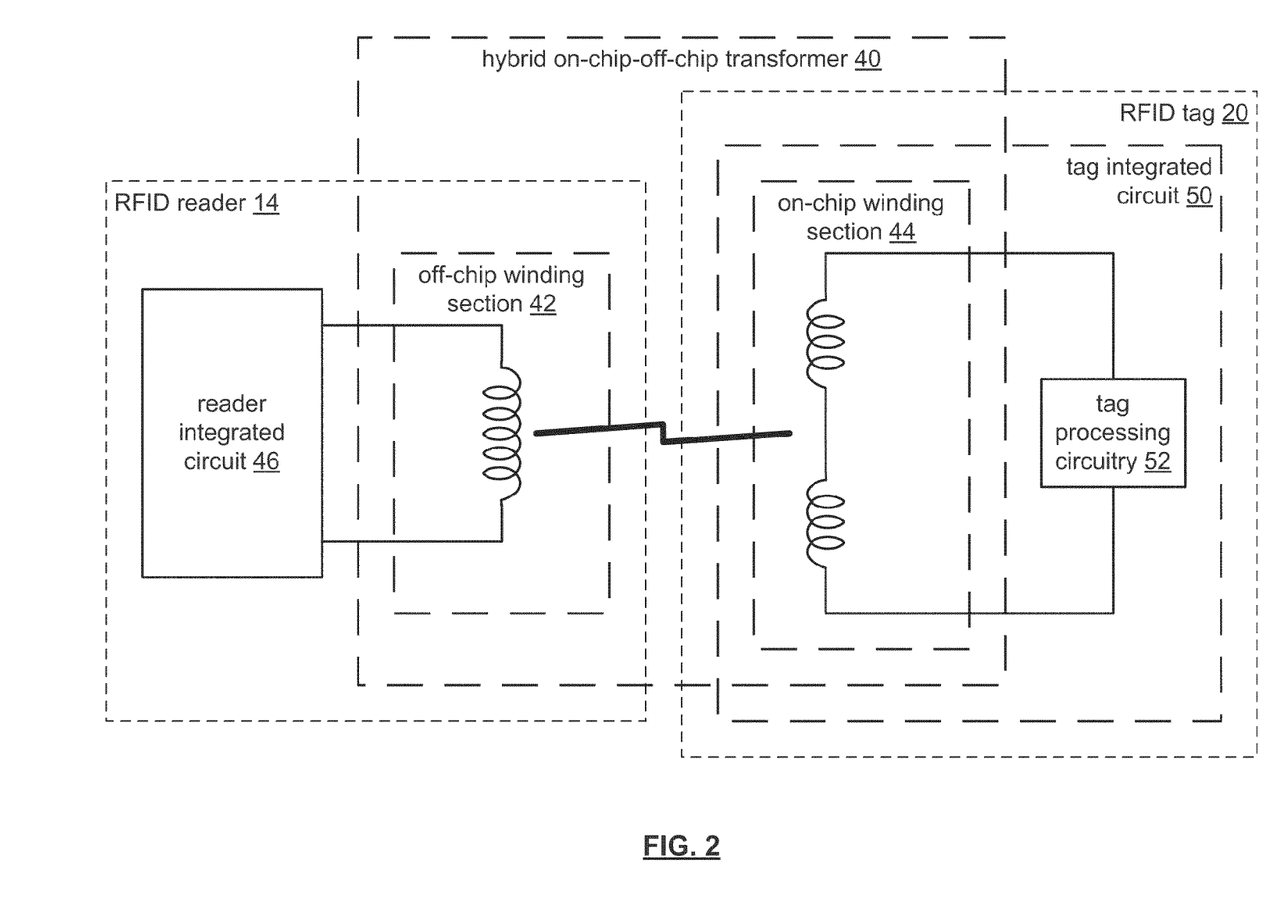
FIG. 2 is a schematic block diagram of a hybrid on-chip-off-chip transformer in accordance with the present invention.

FIG. 2 is a schematic block diagram of a hybrid on-chip-off-chip transformer 40 that includes an off-chip winding section 42 and an on-chip winding section 44. The off-chip winding section 42 may be included in an RFID reader 14 and the on-chip winding section 44 may be on a tag integrated circuit (IC) 50 of and RFID tag 20.

The off-chip winding section 42 is coupled to produce a first electromagnetic signal from a reference source, which may be an RFID reader integrated circuit 46. The on-chip winding section 44 is coupled to derive a second electromagnetic signal from the first electromagnetic signal when the on-chip winding section 44 is within a proximal coupling distance of the off-chip winding section 42.

In addition, the on-chip winding section 44 is coupled to produce the second electromagnetic signal from a second reference source, which may be tag processing circuitry 52 of the tag IC 50. The off-chip winding section 42 is coupled to derive the first electromagnetic signal from the second electromagnetic signal when the on-chip winding section 44 is within a proximal coupling distance of the off-chip winding section 42. Accordingly, the RFID tag 20 may communicate with the RFID reader 14 via the hybrid on-chip-off-chip transformer 40.

Figure 3:
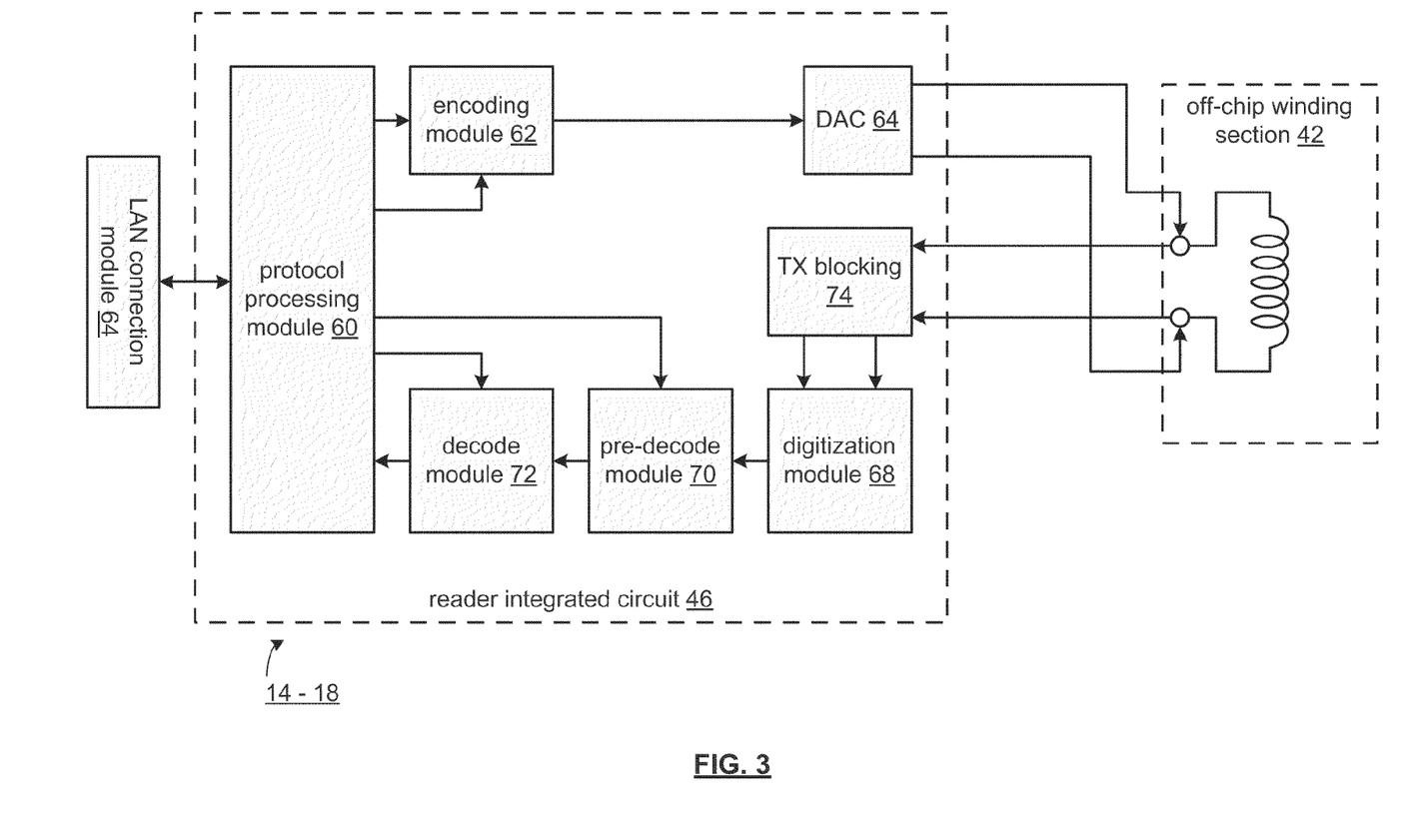
FIG. 3 is a schematic block diagram of an RFID reader in accordance with the present invention.

FIG. 3 is a schematic block diagram of an RFID reader 14-18 that includes an integrated circuit 46, the off-chip winding section 42, and may further include a local area network (LAN) connection module 64. The integrated circuit 46 includes protocol processing module 60, an encoding module 62, a digital-to-analog converter (DAC) 64, a transmit blocking circuit 74, a digitization module 68, and a decoding subsystem, which includes a pre-decode module 70 and a decode module 72. The local area network connection module 64 may include one or more of a wireless network interface (e.g., 802.11n.x, Bluetooth, et cetera) and/or a wired communication interface (e.g., Ethernet, fire wire, et cetera).

The protocol processing module 60 is coupled to prepare data for encoding via the encoding module 62 which may perform a data encoding in accordance with one or more RFID standardized protocols. The encoded data is provided to the digital-to-analog converter 64 which converts the digitally encoded data into an analog signal. The off-chip winding section 42 is coupled to receive the analog signal and to produce therefrom the first electromagnetic signal.

The transmit (TX) blocking circuit 74 blocks energy of the transmit signal such that it does not substantially interfere with the receiving of a response signal received from one or more RFID tags. For a received response signal, the digitization module 48, which may be a limiting module or an analog-to-digital converter, converts the received response signal into a digital signal. The pre-decode module 50 converts the digital signal into a biphase encoded signal or mixed signal in accordance with the particular RFID protocol being utilized. The biphase encoded or mixed signal is provided to the decoding module 52, which recaptures data therefrom in accordance with the particular encoding scheme of the selected RFID protocol. The protocol processing module 40 provides the recovered data to the server and/or computer via the local area network connection module 54. As one of ordinary skill in the art will appreciate, the RFID protocols (such as EPC class 0, EPC class 1, EPC Class 1 Gen 2, ISO 18000-6, etc.) utilize one or more of line encoding schemes such as Manchester encoding, FM0 encoding, FM1 encoding, four-interval bit cell encoding, etc.

Figure 4:
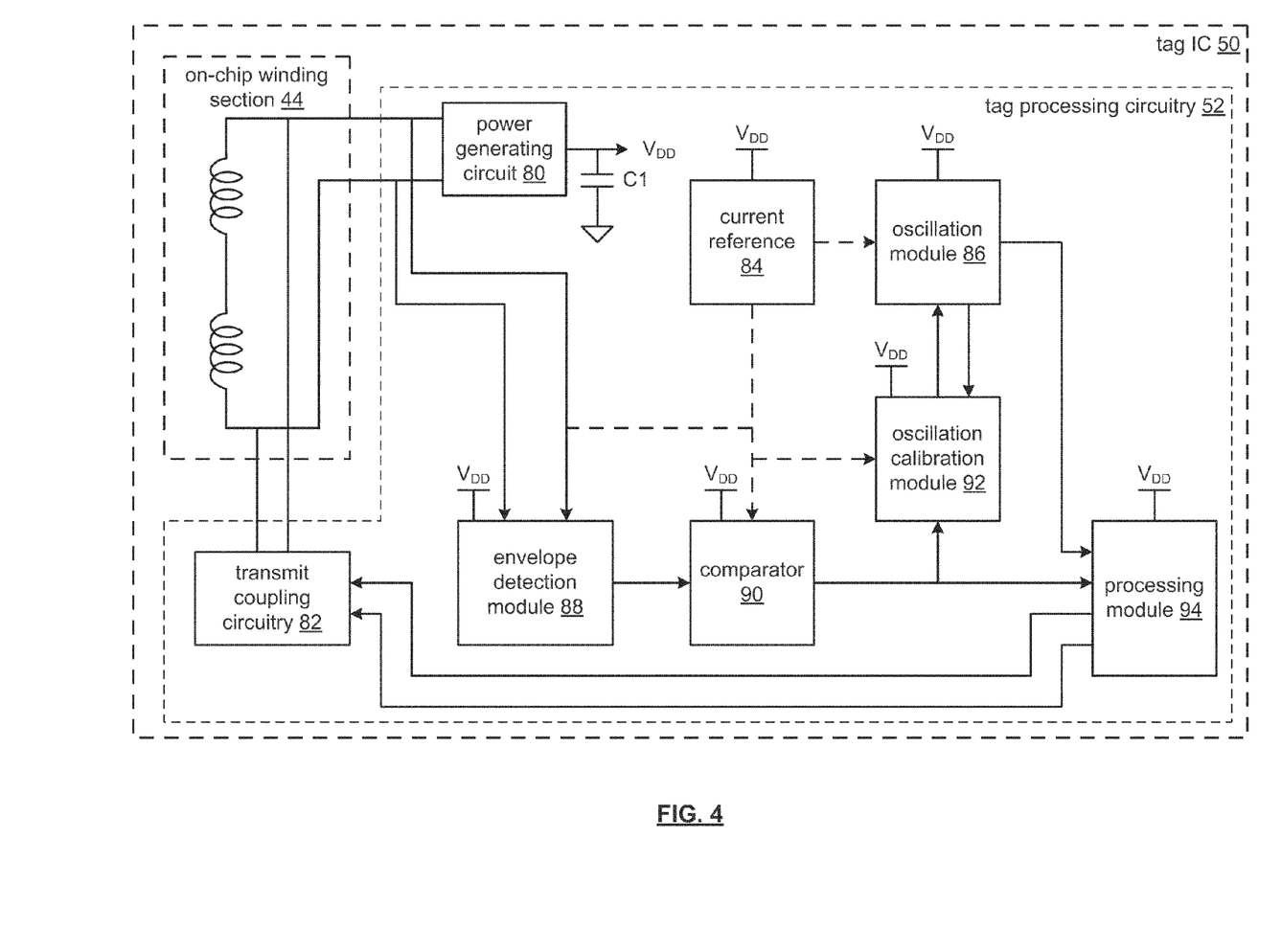
FIG. 4 is a schematic block diagram of an RFID tag in accordance with the present invention.

FIG. 4 is a schematic block diagram of the tag IC 50 of an RFID tag 20-30. The tag IC 50 includes the on-chip winding section 44 and the tag processing circuitry 52. The tag processing circuitry 52 includes a power generating circuit 80, a current reference 84, an oscillation module 86, a processing module 94, an oscillation calibration module 92, a comparator 90, an envelope detection module 88, and transmit coupling circuitry 82. The current reference 84, the oscillation module 86, the processing module 94, the oscillation calibration module 92, the comparator 90, and the envelope detection module 88 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. One or more of the modules may have an associated memory element, which may be a single memory device, a plurality of memory devices, and/or embedded circuitry of the module. Such a memory device may be a read-only memory, random access memory, volatile memory, non-volatile memory, static memory, dynamic memory, flash memory, cache memory, and/or any device that stores digital information. Note that when the module implements one or more of its functions via a state machine, analog circuitry, digital circuitry, and/or logic circuitry, the memory element storing the corresponding operational instructions may be embedded within, or external to, the circuitry comprising the state machine, analog circuitry, digital circuitry, and/or logic circuitry. Further note that, the memory element stores, and the module executes, hard coded and/or operational instructions corresponding to at least some of the steps and/or functions illustrated in this FIG. 4.

In operation, the power generating circuit 80 generates a supply voltage ($V_{DD}$) from the signal provided by the on-chip winding section 44. For example, the on-chip winding section 44 receives an electromagnetic signal from the off-chip winding section 42, which produces a voltage across the terminals of the on-chip winding section 44. The power generating circuit 40 uses the voltage of the on-chip winding section 40 to produce the supply voltage $V_{DD}$, which is stored in capacitor C1.

When the supply voltage $V_{DD}$ is present, the envelope detection module 88 determines an envelope of the signal provided by the on-chip winding section 44, which may include a DC component corresponding to the supply voltage $V_{DD}$. In one embodiment, the signal provided by the on-chip winding section 44 is an amplitude modulation signal, where the envelope of the signal includes transmitted data. The envelope detection module 88 provides an envelope signal to the comparator 90. The comparator 90 compares the envelope signal with a threshold to produce a stream of recovered data.

The oscillation module 86, which may be a ring oscillator, crystal oscillator, or timing circuit, generates one or more clock signals that have a rate corresponding to the rate of the signal provided by the on-chip winding section 44 in accordance with an oscillation feedback signal. For instance, if the signal is a 20 MHz signal, the rate of the clock signals will be n*20 MHz, where "n" is equal to or greater than 1.

The oscillation calibration module 92 produces the oscillation feedback signal from a clock signal of the one or more clock signals and the stream of recovered data. In general, the oscillation calibration module 92 compares the rate of the clock signal with the rate of the stream of recovered data. Based on this comparison, the oscillation calibration module 92 generates the oscillation feedback to indicate to the oscillation module 86 to maintain the current rate, speed up the current rate, or slow down the current rate.

The processing module 94 receives the stream of recovered data and a clock signal of the one or more clock signals. The processing module 94 interprets the stream of recovered data to determine a command or commands contained therein. The command may be to store data, update data, reply with stored data, verify command compliance, acknowledgement, etc. If the command(s) requires a response, the processing module 94 provides a response signal to the transmit coupling circuitry 82 at a rate corresponding to the electromagnetic coupling between the on-chip winding section 44 and the off-chip winding section 42. The on-chip winding section 44 provides the response signal to the off-chip winding section 42 of the RFID reader 14.

The RFID tag 20-30 may further include the current reference 84 that provides one or more reference, or bias, currents to the oscillation module 86, the oscillation calibration module 92, the envelope detection module 88, and the comparator 90. The bias current may be adjusted to provide a desired level of biasing for each of the modules 86, 88, 90, and 92.

Figures 5, 6:
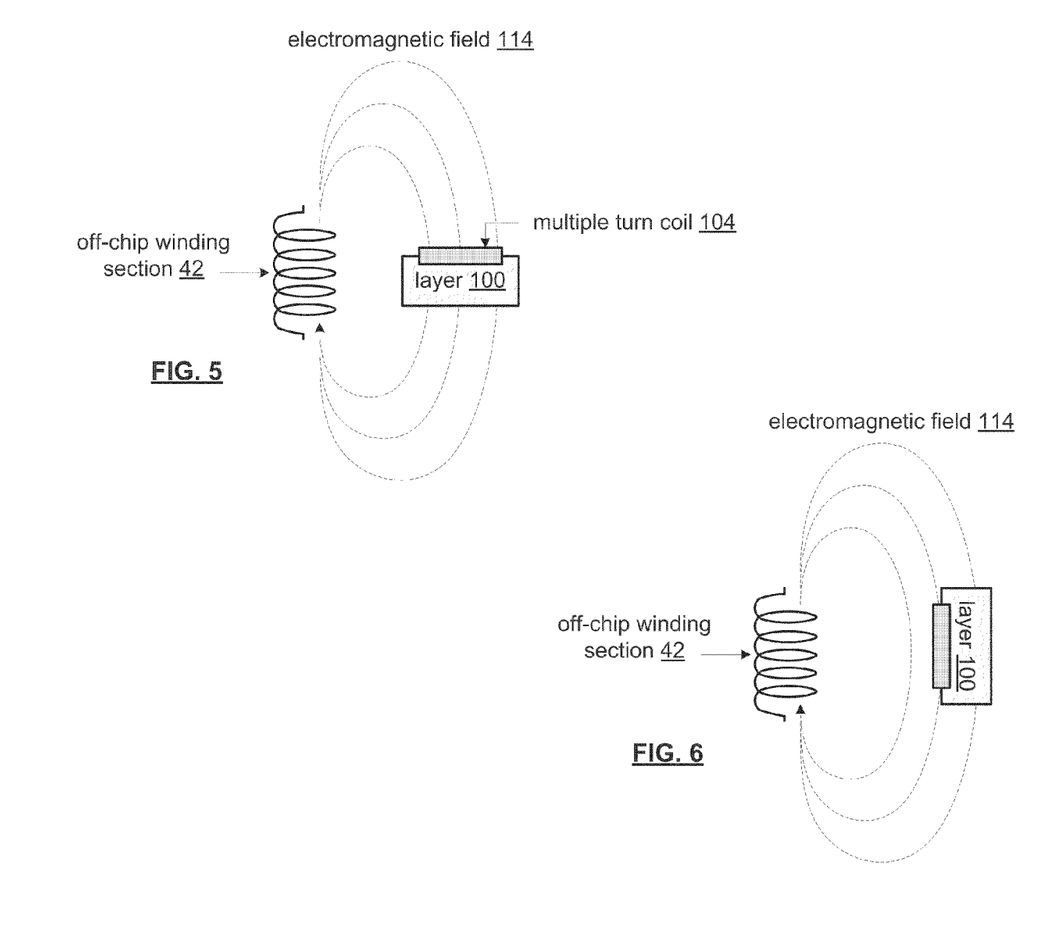
FIG. 5 is a diagram of an off-chip winding section generating a substantially perpendicular electromagnetic field with respect to an on-chip winding section in accordance with the present invention.
FIG. 6 is a diagram of an off-chip winding section generating a substantially parallel electromagnetic field with respect to an on-chip winding section in accordance with the present invention.

FIG. 5 is a diagram of an off-chip winding section 42 generating a substantially perpendicular electromagnetic field 114 with respect to an on-chip winding section 44. In this example, the on-chip winding section 44 includes at least one layer 100 of an IC and at least one multiple turn coil 104 on the at least one layer 100. With a substantially perpendicular electromagnetic field 114 with respect to an on-chip winding section 44, the multiple turn coil 104 functions as a secondary of a transformer, where the off-chip winding section 42 functions as a primary of the transformer. Note that, in one embodiment, the off-chip winding section 42 may include an air core and a first winding wrapped around the air core, wherein flux from the air core substantially provides the first electromagnetic signal 114 to the on-chip winding section 44. Further note that, in another embodiment, the off-chip winding section 42 includes a ferrite core having an air gap and a first winding wrapped around the ferrite core, wherein the air gap substantially provides the first electromagnetic signal 114 to the on-chip winding section 44.

Figure 12:
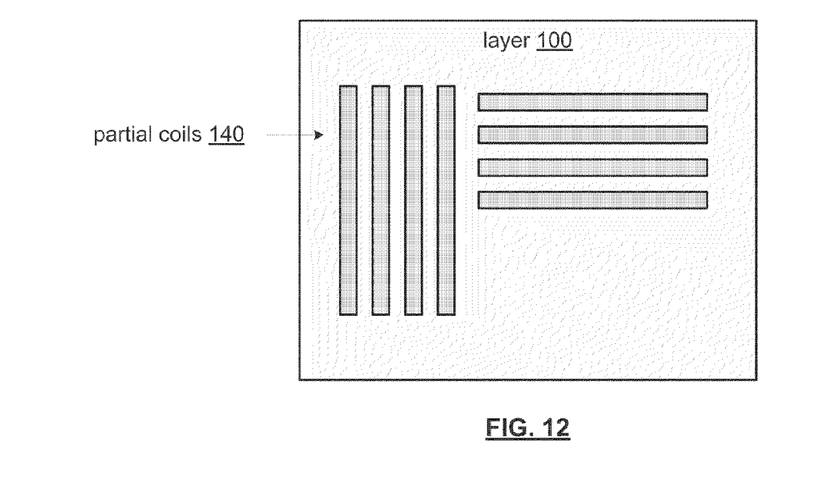
FIG. 12 is a top view of another embodiment of an on-chip winding section in accordance with the present invention.

FIG. 6 is a diagram of the off-chip winding section 42 generating a substantially parallel electromagnetic field 114 with respect to the on-chip winding section 44. In this example, the on-chip winding section 44 would not include a multiple turn winding, but a plurality of partial coils on at least one layer of a multiple layer integrated circuit (IC) die. FIG. 12 illustrates an embodiment of the on-chip winding section 44 including a plurality of partial coils 140 on a layer 100 of an IC. In this embodiment, since the electromagnetic field 114 is parallel to the coils 140, the current induced in the partial coils 140 is perpendicular to the electromagnetic field 114 in accordance with the right hand rule. Thus, if a full turn were used, the induce current on one side of the turn would be in the opposite direction of the induced current on the other side of the turn, thereby substantially canceling each other out. As such, the partial coils 140 can be coupled together to accumulate the induced current and achieve a desired level of current and/or voltage across the on-chip winding section 44.

Figure 7:
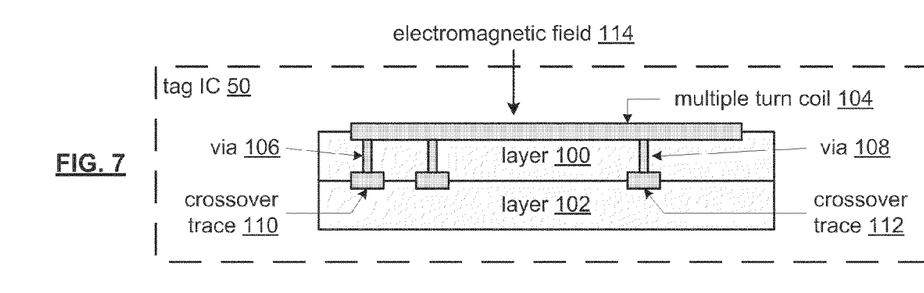
FIGS. 7 and 8 are side and bottom views of an embodiment of an on-chip winding section in accordance with the present invention.
Figure 8:
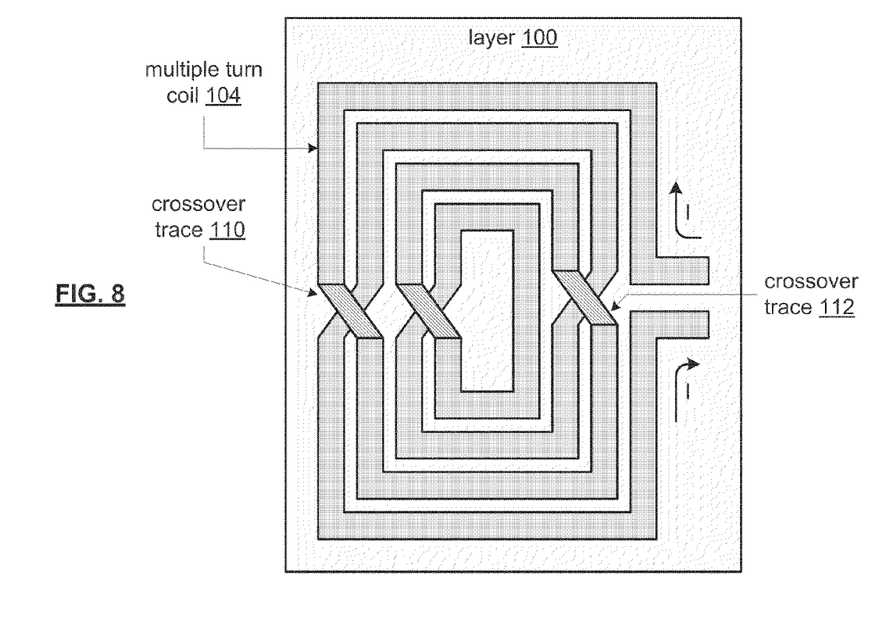

FIGS. 7 and 8 are side and bottom views of an embodiment of an on-chip winding section 44 that includes a multiple turn coil 104 on at least one layer 100 of a multiple layer integrated circuit (IC) die 50. In this embodiment, the multiple turn coil 104 includes cross over traces 110-112 and vias 106-108 to complete the coil 104. When the off-chip winding section 42 is within a proximal coupling distance (e.g., the on-chip winding section 44 is within the electromagnetic field 114 created by the off-chip winding section 42) and the electromagnetic field 114 of the first electromagnetic signal (e.g., the electromagnetic field induced by a voltage and/or current of the off-chip winding 42 creating the electromagnetic field and/or the voltage and/or current) is substantially perpendicular to the at least one layer 100 of the multiple layer IC die, a current (I) is induced in the multiple turn coil 104. Note that the cross over traces 110 and 112 are on a second layer 102 of the IC 50.

Figure 9:
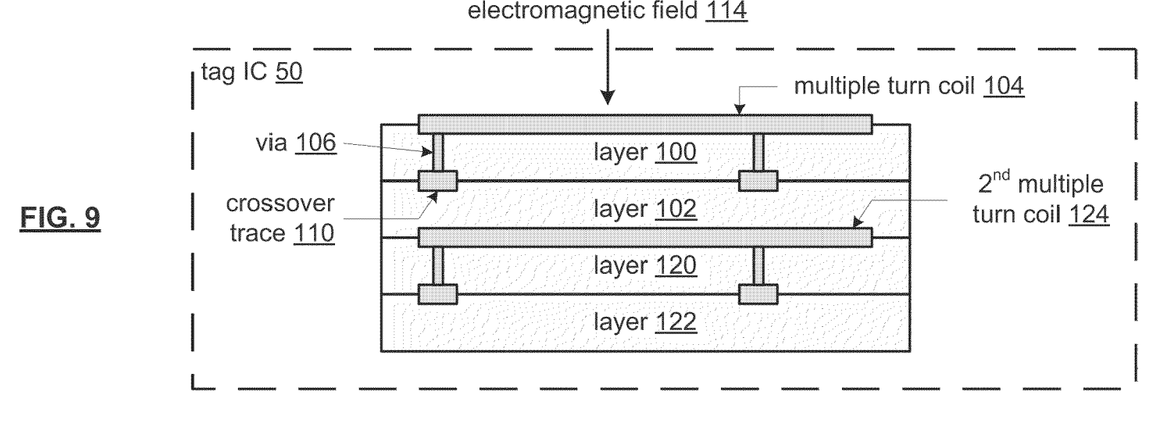
FIG. 9 is a side view of another embodiment of an on-chip winding section in accordance with the present invention.

FIG. 9 is a side view of another embodiment of an on-chip winding section 44 that includes a first multiple turn coil 104 on at least one layer 100 of a multiple layer integrated circuit (IC) die 50 and a second multiple turn coil 124 on at least one other layer 120 and 122 of the multiple layer IC die 50. In this embodiment, the first and second multiple turn coils 104 and 124 may be coupled in series or in parallel to provide the output (e.g., the second electromagnetic signal) of the on-chip winding section 44. In this embodiment, the electromagnetic field 114 is substantially perpendicular to the at least one layer 100 of the multiple layer IC die 50.

Figure 10:
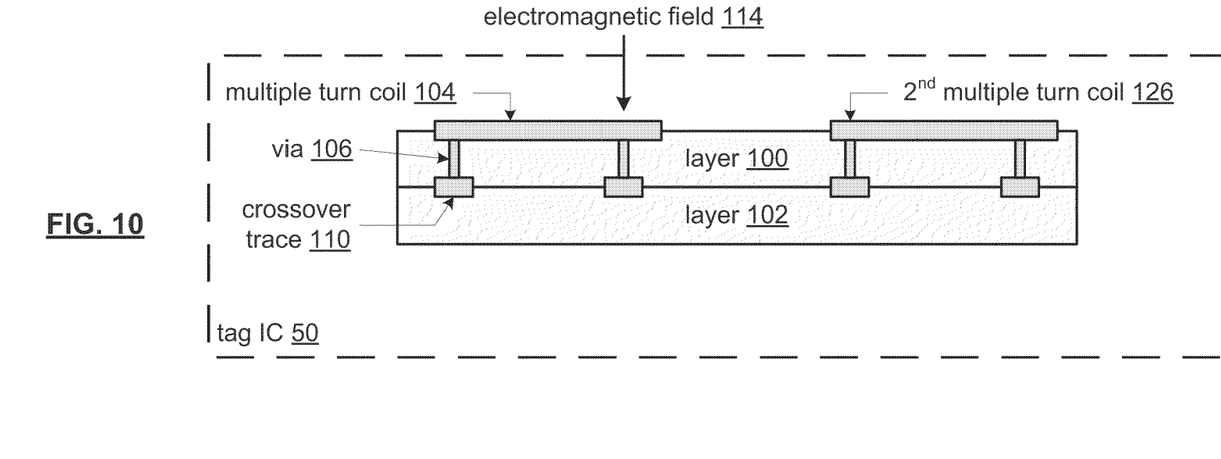
FIG. 10 is a side view of another embodiment of an on-chip winding section in accordance with the present invention.

FIG. 10 is a side view of another embodiment of an on-chip winding section 44 that includes a plurality of multiple turn coils 104 and 126 on at least one layer 100 of a multiple layer integrated circuit (IC) die 50. In this embodiment, the plurality of multiple turn coils 104 and 126 may be coupled in series or in parallel to provide the output (e.g., the second electromagnetic signal) of the on-chip winding section 44. In this embodiment, the electromagnetic field 114 is substantially perpendicular to the at least one layer 100 of the multiple layer IC die 50.

Figure 11:
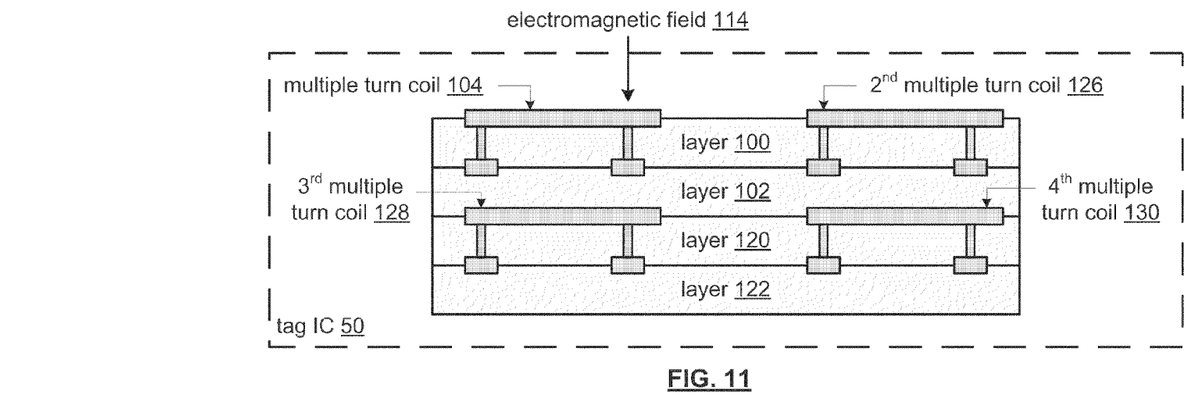
FIG. 11 is a side view of another embodiment of an on-chip winding section in accordance with the present invention.

FIG. 11 is a side view of another embodiment of an on-chip winding section 44 that includes a first plurality of multiple turn coils 104 and 126 on at least one layer 100 of a multiple layer integrated circuit (IC) die 50 and a second plurality of multiple turn coils 128 and 130 on at least one other layer 120 of the multiple layer IC die 50. In this embodiment, the plurality of multiple turn coils 104, 126, 128, and 130 may be coupled in series or in parallel to provide the output (e.g., the second electromagnetic signal) of the on-chip winding section 44. In this embodiment, the electromagnetic field 114 is substantially perpendicular to the at least one layer 100 of the multiple layer IC die 50.

Figures 13, 14, 15:
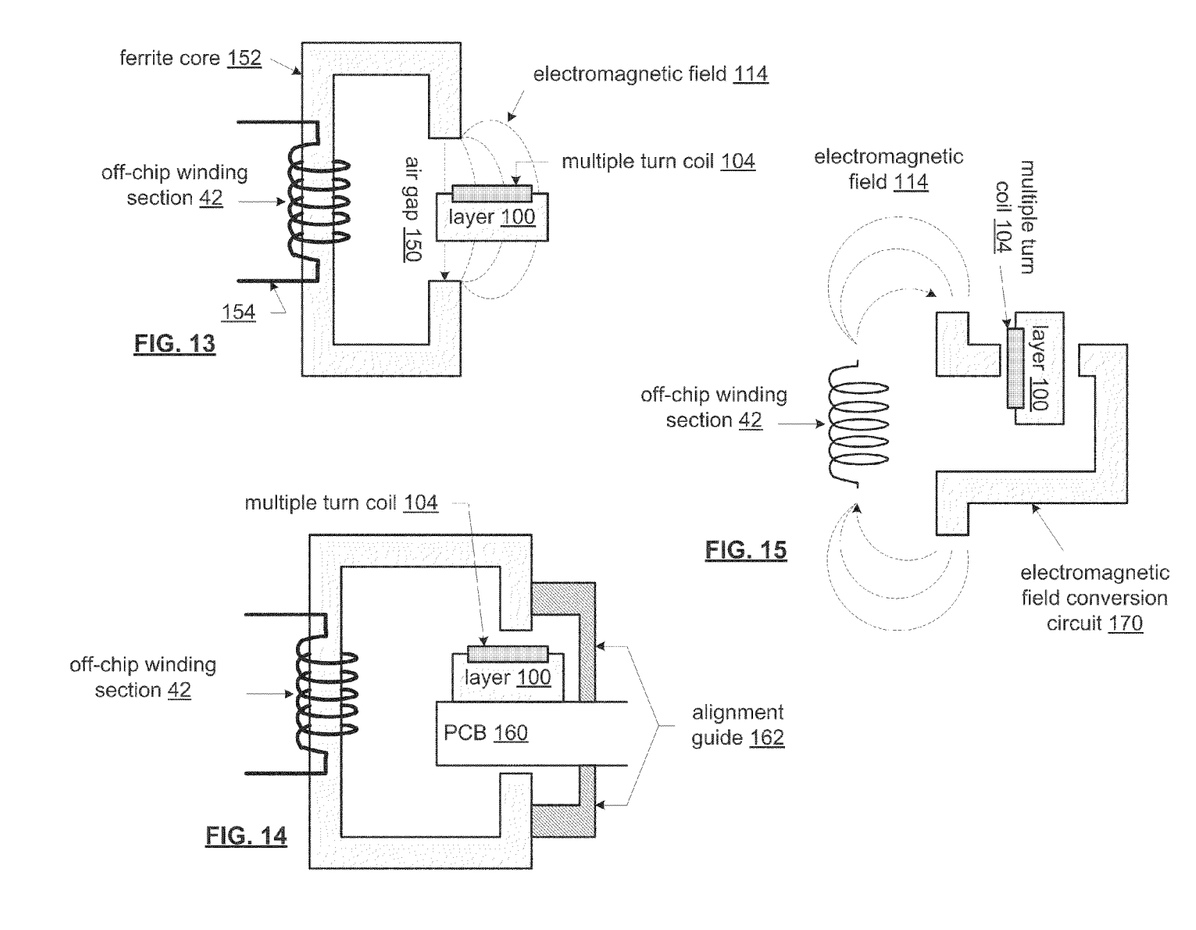
FIG. 13 is a diagram of an embodiment of an off-chip winding section generating a substantially perpendicular electromagnetic field with respect to an on-chip winding section in accordance with the present invention.
FIG. 14 is a diagram of another embodiment of an off-chip winding section generating a substantially perpendicular electromagnetic field with respect to an on-chip winding section in accordance with the present invention.
FIG. 15 is a diagram of another embodiment of an off-chip winding section generating a substantially perpendicular electromagnetic field with respect to an on-chip winding section in accordance with the present invention.

FIG. 13 is a diagram of an embodiment of an off-chip winding section 42 that includes a ferrite core 152 having an air gap 150 and a first winding 154 wrapped around the ferrite core 152. In this embodiment, the air gap 150 substantially provides the first electromagnetic signal, and/or field, 114 to the on-chip winding section 44 (i.e., the multiple turn coil 104 on layer 100). As shown, the air gap 150 is large enough for the on-chip winding section 44 to pass through, thus providing a substantially perpendicular electromagnetic field with respect to an on-chip winding section 44.

FIG. 14 is a diagram of another embodiment of an off-chip winding section 42 generating a substantially perpendicular electromagnetic field 114 with respect to an on-chip winding section 44. In this embodiment, the off-chip winding section 42 includes an alignment guide 162 such that, when the off-chip winding section 42 is within the proximal coupling distance of the on-chip winding section 44, the air gap 150 provides a substantially perpendicular electromagnetic field 114 of the first electromagnetic signal to the second winding section 44.

FIG. 15 is a diagram of another embodiment of an off-chip winding section 42 generating a substantially perpendicular electromagnetic field 114 with respect to an on-chip winding section 44. In this embodiment, the off-chip winding section 42 includes an electromagnetic field conversion circuit 170, which may be a ferrite core, that is coupled to the second winding section 44. The electromagnetic field conversion circuit 170 changes orientation of an electromagnetic field 114 provided by the air gap such 150 that the electromagnetic field 114 is substantially perpendicular with respect to at least one layer 100 of a multiple layer integrated circuit die 50 on which the second winding section 44 is located.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. A radio frequency identification (RFID) system comprises:
   an RFID reader coupled to transmit first electromagnetic signal via an off-chip winding section of a hybrid on-chip-off-chip transformer; and
   an RFID tag coupled to receive the first electromagnetic signal via an on-chip winding section of the hybrid on-chip-off-chip transformer, wherein the on-chip winding section derives a second electromagnetic signal from the first electromagnetic signal when the on-chip winding section is within a proximal coupling distance of the off-chip winding section, wherein the on-chip winding section includes a first plurality of multiple turn coils on at least one layer of a multiple layer integrated circuit (IC) die, in which the proximal coupling distance provides a substantially perpendicular, with respect to the at least one layer of the multiple layer IC die, electromagnetic field of the first electromagnetic signal to the first plurality of multiple turn coils, and wherein the on-chip winding section also includes a second plurality of multiple turn coils on at least one other layer of the multiple layer IC die, in which the proximal coupling distance provides a substantially perpendicular, with respect to the at least one other layer of the multiple layer IC die, electromagnetic field of the first electromagnetic signal to the second plurality of multiple turn coils, and wherein the first and second pluralities of multiple turn coils provide the second electromagnetic signal.

2. The RFID system of claim 1, wherein the off-chip winding section includes a ferrite core having an air gap and a first winding wrapped around the ferrite core, in which the air gap substantially provides the first electromagnetic signal to the on-chip winding section.

3. The RFID system of claim 2, wherein the off-chip winding section further includes an alignment guide such that, when the off-chip winding section is within the proximal coupling distance of the on-chip winding section, the air gap provides the substantially perpendicular electromagnetic field of the first electromagnetic signal.

4. The RFID system of claim 2 further comprises:
   an electromagnetic field conversion circuit coupled to the on-chip winding section, in which when the off-chip winding section is within the proximal coupling distance of the on-chip winding section, the electromagnetic field conversion circuit changes orientation of an electromagnetic field provided by the air gap to be substantially perpendicular to layers of the IC die.

5. The RFID system of claim 1, wherein the off-chip winding section includes an air core and a first winding wrapped around the air core, in which flux from the air core substantially provides the first electromagnetic signal to the on-chip winding section.

* * * * *